(12) United States Patent
Tien et al.

(10) Patent No.: US 7,981,212 B2
(45) Date of Patent: Jul. 19, 2011

(54) FLASH LAMP ANNEALING DEVICE

(75) Inventors: Fu-Kang Tien, Hsinchu (TW); Jui-Pin Hung, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1512 days.

(21) Appl. No.: 11/391,563

(22) Filed: Mar. 29, 2006

(65) Prior Publication Data

US 2007/0235662 A1 Oct. 11, 2007

(51) Int. Cl.
*C30B 1/04* (2006.01)
(52) U.S. Cl. ............ 117/4; 117/8; 117/9; 117/200; 117/201; 117/202
(58) Field of Classification Search .......... 117/200, 117/201, 202, 4, 8, 9
See application file for complete search history.

(56) References Cited

U.S. PATENT DOCUMENTS

| 2004/0018702 A1* | 1/2004 | Ito et al. ............ 438/530 |
| 2006/0228897 A1* | 10/2006 | Timans ............ 438/758 |
| 2008/0069550 A1* | 3/2008 | Timans et al. ............ 392/411 |

FOREIGN PATENT DOCUMENTS

JP 2002-252174 A 9/2002

* cited by examiner

*Primary Examiner* — Robert M Kunemund
(74) *Attorney, Agent, or Firm* — Birch, Stewart, Kolasch & Birch, LLP

(57) ABSTRACT

A flash lamp annealing device comprises a heater plate, a loader, a lamp set and a control circuit. The heater plate heats a wafer to a predetermined temperature. The wafer is loaded on the loader disposed on the heater plate. The lamp set has one or a plurality of lamps to provide the wafer with a power. The control circuit is coupled to the lamp set to control the flash time of the lamp set.

19 Claims, 3 Drawing Sheets

FLASH LAMP ANNEALING DEVICE

BACKGROUND

The invention relates to a semiconductor device, and more particularly to a flash lamp annealing device with a flash time control device.

After the ion-implantation of a wafer, the dopant damages the silicon crystal lattices on the surface of the wafer. To reconstruct the silicon crystal lattices, the wafer must be processed in an annealing procedure. One such annealing technique is known as furnace annealing, which processes the wafers in a batch type process but requires a longer processing period, such as 30 minutes or longer. Another annealing technique is known as Rapid Thermal Annealing, RTA, which reduces the amount of time that a semiconductor device is exposed to high temperatures during processing. Although the processing time required by the RTA is reduced to about 10 second or less, RTA is unsatisfied factor as it uses halogen lamps, which can form an extension with low resistance but the depth of the extension becomes large, such as, over 40-nm.

Flash lamp annealing is a new technology using a Xenon lamp to overcome annealing difficulties at the 65-nm manufacturing process technology node. The Xenon lamp of the flash lamp annealing device heats and maintains wafer temperature at over 900 degrees centigrade for only 0.8 milliseconds, about 1/3000 compared to about 2 seconds required by the present RTA processes. The present limitations of flash lamp annealing comprise process and hardware instability and the narrow process window for engineers to develop advanced processes. Moreover, the flash time is inflexible and the probability of wafer breakage is increased due to acute wafer variation temperature. A flash lamp annealing device with a flash time control device for widening the process window is desirable.

SUMMARY

The invention provides a flash lamp annealing device that controls the flash time to obtain a wider tuning window.

In one aspect of the invention, the flash lamp annealing device comprises a heating plate, a loader, a lamp set and a control circuit. The heating plate heats a wafer to a predetermined temperature. The wafer is loaded on the loader disposed on the heating plate. The lamp set has one or a plurality of lamps to provide a power to process the wafer. The control circuit is coupled to the lamp set to control the flash time of the lamp set.

In another aspect, the invention discloses a flash time control method of a flash lamp annealing device that comprises the following steps: a flash time control circuit coupled to the annealing device, wherein the flash time control circuit has an adjustable inductor and a capacitor is provided; a flash time of a wafer processed in the annealing device is determined; an inductance of the inductor is adjusted to meet the flash time of the wafer.

In another aspect, the invention discloses a flash lamp annealing device comprises a heating plate, a loader, a lamp set and a control circuit. The heating plate heats a wafer to a predetermined temperature. The wafer is loaded on the loader disposed on the heating plate. The lamp set has one or a plurality of lamps to provide a power to process the wafer. The control circuit is coupled to the lamp set to control the flash time of the lamp set. The control circuit further comprises an adjustable inductor, a capacitance and an adjustable. The adjustable inductor has a first terminal coupled to the lamp set. The capacitance has a first terminal coupled to the adjustable inductance and at least one second terminal coupled to the lamp set. The adjustable capacitance is connected in parallel to the capacitance.

DETAILED DESCRIPTION

Figure 1:
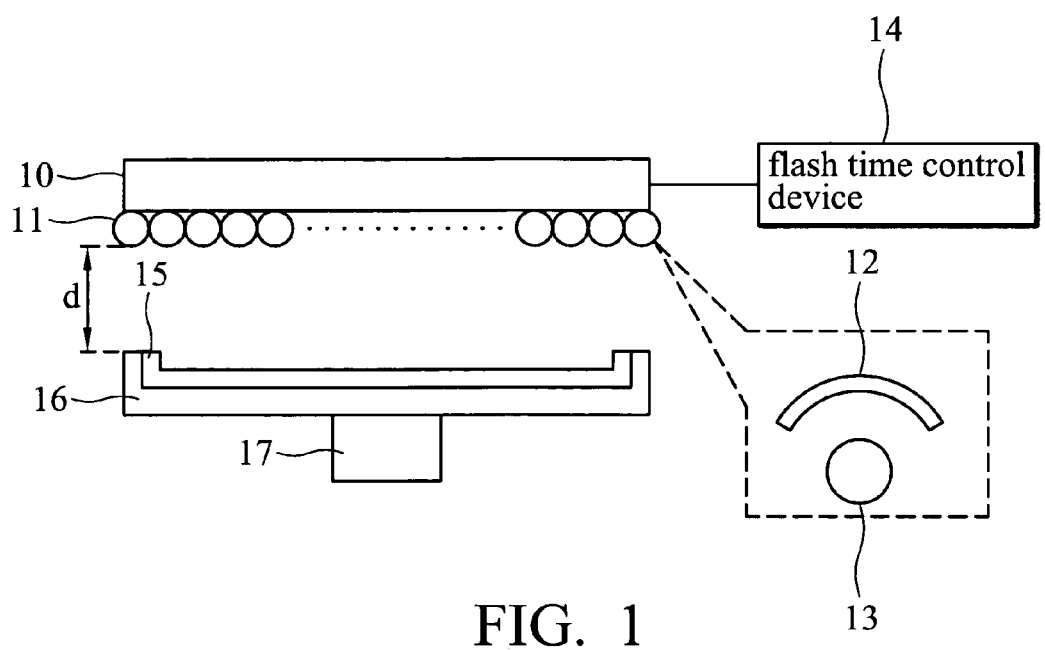
FIG. 1 is a schematic diagram of an embodiment of a flash lamp annealing device according to the invention.

FIG. 1 is a schematic diagram of an embodiment of a flash lamp annealing device according to the invention. The lamp set 10 has a plurality of lamp units and the number of the lamp units is about 20 to 40, wherein each lamp unit comprises a reflection device 12 and a flash lamp 13, such as a Xenon lamp. The flash time of flash lamps 13 is adjusted by a flash time control device 14. The reflection device 12 is operable to reflect light emitted by the flash lamp 13 and thus avoid power dissipation. The wafer is loaded on a loader 15 disposed on a heater plate 16. The lamp set has a light emitting area larger than an area of the wafer. The heater executes a pre-heating procedure to heat the wafer to a predetermined temperature, such as 950° C., and the lamp set 10 flashes at the wafer to complete the flash lamp annealing process. The pre-heating procedure is an important step in addressing non-uniformity issues caused by the flash lamp annealing process. Depending on the wafer patterns, the wafer surface is not uniformly heated when only flash lamp annealing is used. By pre-heating the entire wafer on the heater plate 16, the lamp set 10 can anneal the wafer surface uniformly with lower energy. Furthermore, a lifting device 17 is provided to adjust the distance d between the lamp set 10 and the loader 15. The flash lamp annealing device can adjust the power that the wafer received by adjusting the distance d.

Figure 2:
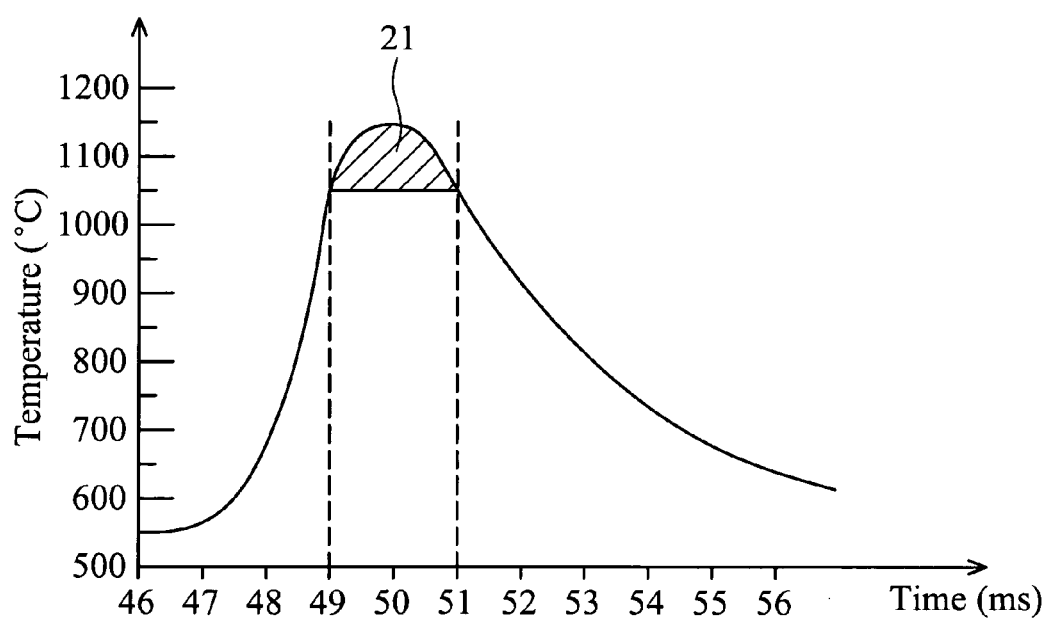
FIG. 2 is an temperature variation schematic diagram of the flash lamp annealing device of FIG. 1.

FIG. 2 is a temperature variation schematic diagram of the flash lamp annealing device of FIG. 1. The heater plate 16 heats the wafer from 550° C. to 950° C. for a period between 47 ms to 49 ms. The lamp set 10 flashes at the wafer to heat the wafer to 1050° C. Due to the increasing flash time of the lamp set 10, the temperature variation of the wafer decreases, thus, the probability of wafer breakage also decreases.

Figure 3:
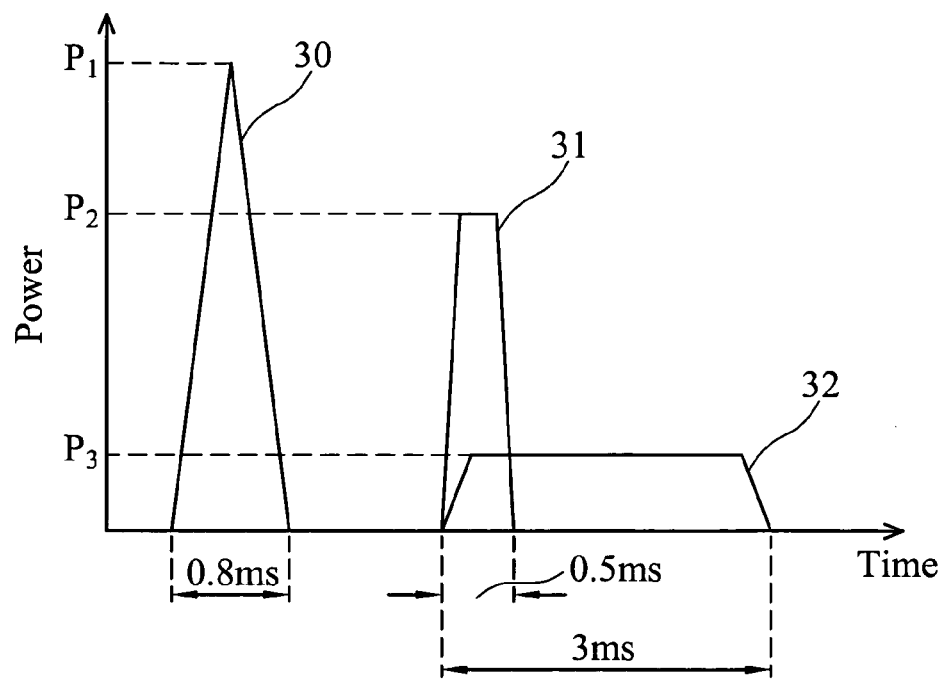
FIG. 3 is a power comparison schematic diagram of the conventional flash lamp annealing device and the flash lamp annealing device of FIG. 1.

FIG. 3 is a power comparison schematic diagram of the conventional flash lamp annealing device and the flash lamp annealing device of FIG. 1. Area 30 is a power distribution graph of the conventional flash lamp annealing device and areas 31 and 32 shows a power distribution graph of the flash lamp annealing device of FIG. 1. The power received by the wafer has a direct proportion to the superficial measurement of the area, such as area 30. In FIG. 3, areas 30, 31 and 32 have the same superficial measurement, and indicating that the wafer receives the same power. The power provided by the conventional flash lamp annealing device varies like a pulse, rises to a peak, such as power p1, rapidly and also rapidly decreases to the original temperature, and an acute temperature variation of the wafer is generated thus. In areas 31 and 32, the flash lamp annealing device of FIG. 1 provides and fixes s power to a predetermined power, such as power p2 and p3, and stops output of the power when the wafer receives enough power. In this way, the power is distributed smoothly and the temperature variation of the wafer decreases.

Figure 4:
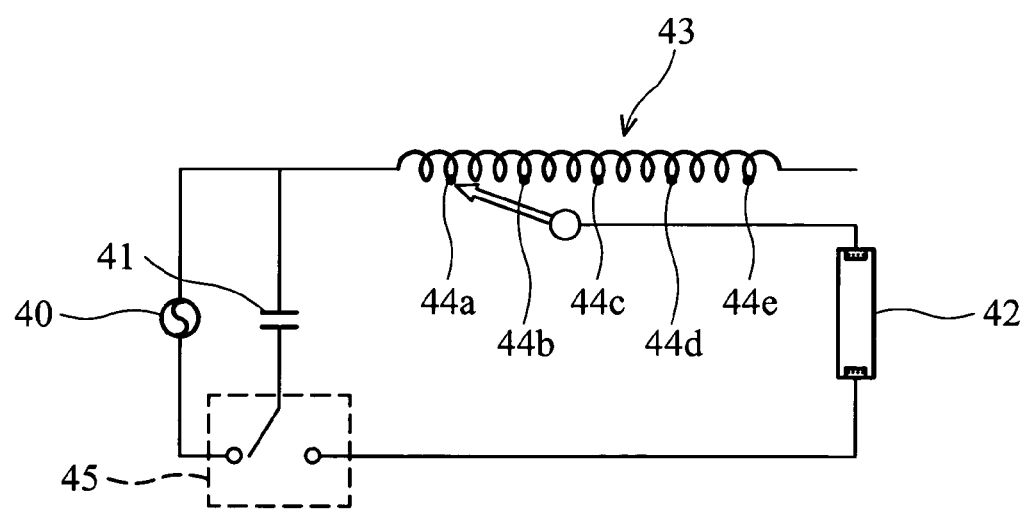
FIG. 4~6 is a schematic circuit diagram of an embodiment of the flash time control device according to the invention.
Figure 5:
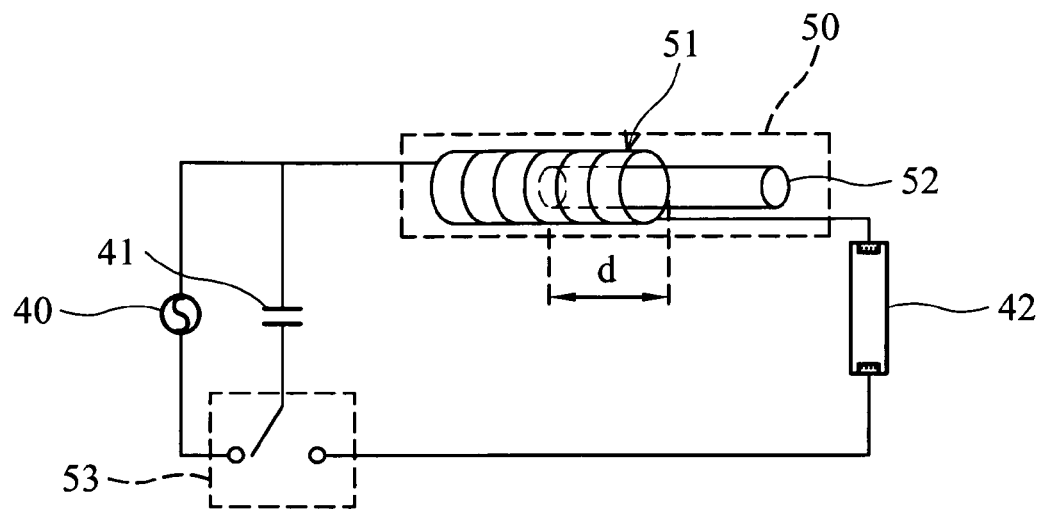
Figure 6:
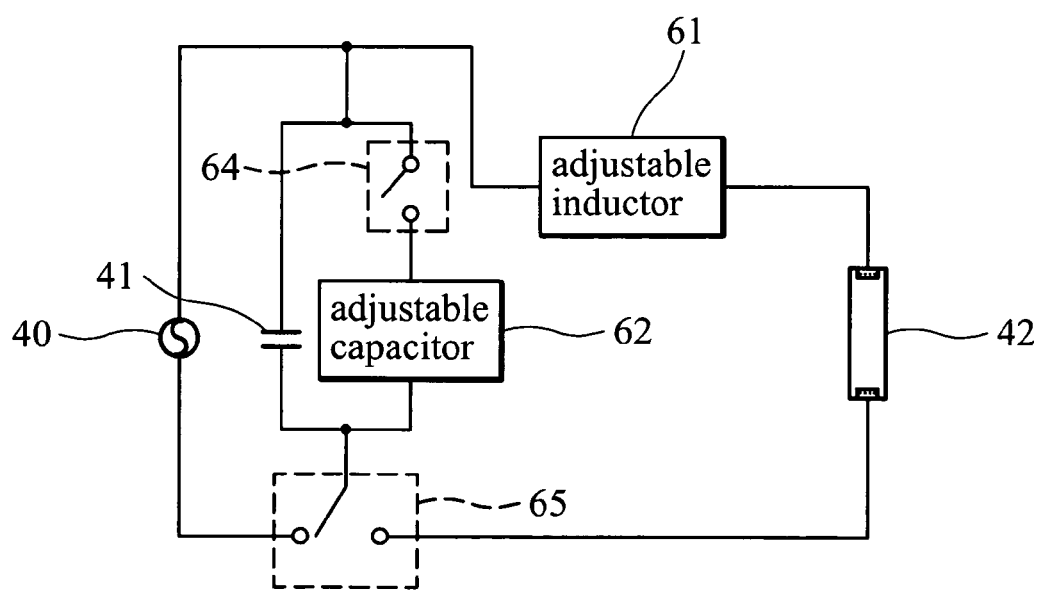

FIGS. 4~6 are schematic circuit diagrams of embodiments of the flash time control device of FIG. 1 according to the invention. In the invention, one preferable embodiment of the flash time is about 0.1 ms to 1000 ms. In FIG. 4, a DC power source 40 is parallel connected to a capacitor 41. The output voltage of the DC power source 40 is adjustable, thus, the power provided by the flash lamp 42 is adjustable. For example, if the flash lamp 42 has to provide lower power, the DC power source 40 outputs lower voltage, such as 1000V, and if the flash lamp 42 has to provide higher power, the DC power source 40 outputs higher voltage, such as 3000V. The capacitor 41 has two terminals, wherein one is connected to a terminal of an adjustable inductor 43 and the other is connected to a switch 45. The switch 45 has one terminal coupled to the DC power source 40 and another terminal coupled to another terminal of the capacitor 41 or one terminal of a flash lamp 42. When the switch 45 is coupled to the DC power source 40 and the capacitor 41, the capacitor 41 charges, and when the capacitor 41 is completely charged, the switch 41 is coupled to the DC power source 40 and the flash lamp 42, thus, the flash lamp 42 turns on until the capacitor 41 is completely discharged. Another terminal of the flash lamp 42 is connected to another terminal of the adjustable inductor 43, such as node 44a, 44b. The adjustable inductor 43 is made by coiling a wire around a core and the inductance of the adjustable inductor 43 is determined by the number times the wire is coiled around the core, wherein the nodes 44a~44e determine the number of different loops. Since the flash time of the flash lamp 42 is determined by the capacitor 41 and the inductance of the adjustable inductor 43, the nodes 44a~44e can determine different inductance to indicate different flash time. For example, the node 44a indicates a flash time of 0.5 ms and node 44b indicates a flash time of 1 ms.

In FIG. 5, the inductance of an adjustable inductor 50 is determined by the length d which is the length of a metal core 52 inside the coil 51. The switch 53 has one terminal coupled to the DC power source 40 and another terminal coupled to another terminal of the capacitor 41 or one terminal of a flash lamp 42. When the switch 53 is coupled to the DC power source 40 and the capacitor 41, the capacitor 41 charges, and when the capacitor 41 is completely charged, the switch 41 is coupled to the DC power source 40 and the flash lamp 42, thus, the flash lamp 42 turns on until the capacitor 41 is completely discharged. According to the operation of the circuit of FIG. 5, the inductance of the adjustable inductor is determined by moving the metal core 52, and thus, the flash time is also adjusted.

In FIG. 6, the capacitor 41 further parallel connects an adjustable capacitor 62. The flash time of the flash lamp 42 is determined by an equivalent capacitance of the capacitor 41 and adjustable capacitors 62 and the inductance of the adjustable inductor 61. The switch 63 has one terminal coupled to the DC power source 40 and another terminal coupled to the node 65 or one terminal of a flash lamp 42. When the switch 53 is coupled to the DC power source 40 and the node 65, the capacitor 41 and the adjustable capacitor 62 charge, and when the capacitor 41 and the adjustable capacitor 62 are completely charged, the switch 41 is coupled to the DC power source 40 and the flash lamp 42, thus, the flash lamp 42 turns on until the capacitor 41 the adjustable capacitor 62 are completely discharged. The adjustable capacitor 62 is further coupled to a switch 64. When the switch 64 turns on, the adjustable capacitor 62 operates with the capacitor 41, and when the switch 64 turns off, the flash time of the flash lamp is only determined by the capacitor 41 and the adjustable inductor. According to the operation of the circuit of FIG. 6, the engineer can adjust one or both of the adjustable capacitor 62 and the adjustable inductor 61 to adjust the flash time of the flash lamp 42.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash lamp annealing device, comprising:
   a heating plate for heating a processed material;
   a loader disposed on the heating plate for loading the processed material;
   a lamp set having one or a plurality of lamps for providing the processed material with a power; and
   a control circuit coupled to the lamp set for controlling a flash time of the lamp set, wherein the control circuit comprises:
      an adjustable inductor having a first terminal coupled to the lamp set; and
      a capacitor having a first terminal coupled to the adjustable inductor and a second terminal coupled to the lamp set.

2. The device of claim 1, further comprising an adjustable capacitor connected in parallel to the capacitor.

3. The device of claim 1, wherein the adjustable inductor comprises a plurality of second terminals to determine different inductance values.

4. The device of claim 1, wherein the processed material is a wafer.

5. The device of claim 1, wherein the adjustable inductor is made by forming a coil of wire around a core.

6. The device of claim 5, wherein the core is a metal.

7. The device of claim 6, wherein an inductance of the inductor is affected by a distance of the core inside the coil of wire.

8. The device of claim 1, wherein the lamp set has a light emitting area A1 and the loader has an area A2 smaller than A1.

9. The device of claim 1, wherein the flash time is about 0.1 ms to 1000 ms.

10. The device of claim 1, wherein the power is in direct proportion to the flash time and a temperature of the wafer.

11. The device of claim 10, wherein the control circuit decreases the temperature of the wafer by increasing the flash time.

12. A flash time control method for the flash lamp annealing device as claimed in claim 1, the method comprising:
   determining a flash time of a wafer processed in the annealing device; and
   adjusting an inductance of the inductor to meet the flash time of the wafer.

13. The method of claim 12, wherein the control circuit further comprises an adjustable capacitor parallel connected to the capacitor, and the flash time can be adjusted by each or both the adjustable inductor and the adjustable capacitor.

14. The method of claim 12, further comprising: heating the wafer to a predetermined temperature.

15. A flash lamp annealing device, comprising:
   a heating plate for heating a processed material;
   a loader disposed on the heating plate for loading the processed material;

a lamp set having one or a plurality of lamps for providing the processed material with a power; and a control circuit coupled to the lamp set to control a flash time of the lamp set, comprising:

an adjustable inductor having a first terminal coupled to the lamp set;

a capacitor having a first terminal coupled to the adjustable inductor and at least one second terminal coupled to the lamp set; and an adjustable capacitor connected in parallel to the capacitor.

16. The device of claim 15, wherein the adjustable inductor is made by forming a coil of wire around a core.

17. The device of claim 16, wherein the core is a metal.

18. The device of claim 16, wherein the lamp set has a light emitting area A1 and the loader has an area A2 smaller than A1.

19. The device of claim 16, wherein the flash time is about 0.1 ms to 1000 ms.

* * * * *